(12) United States Patent
Wang et al.

(10) Patent No.: US 7,375,435 B2
(45) Date of Patent: May 20, 2008

(54) CHIP PACKAGE STRUCTURE

(75) Inventors: Meng-Jen Wang, Pingtung (TW);
Chih-Ming Chung, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 120 days.

(21) Appl. No.: 10/906,536

(22) Filed: Feb. 24, 2005

(65) Prior Publication Data
US 2005/0189633 A1 Sep. 1, 2005

(30) Foreign Application Priority Data
Feb. 26, 2004 (TW) ............... 93104889 A

(51) Int. Cl.
*H01L 23/48* (2006.01)
*H01L 23/52* (2006.01)
*H01L 29/40* (2006.01)

(52) U.S. Cl. .................. 257/783; 257/787; 257/790; 257/778; 257/777; 257/E23.127

(58) Field of Classification Search ............ 257/787, 257/790, 778, 783, 780, 777, E12.127
See application file for complete search history.

(56) References Cited

U.S. PATENT DOCUMENTS

| 5,959,363 | A | * | 9/1999 | Yamada et al. | ............ 257/787 |
| 6,150,193 | A | * | 11/2000 | Glenn | ........................ 438/113 |
| 6,265,782 | B1 | * | 7/2001 | Yamamoto et al. | ......... 257/783 |
| 6,308,938 | B1 | * | 10/2001 | Futakuchi | ................... 257/780 |
| 6,448,665 | B1 | * | 9/2002 | Nakazawa et al. | .......... 257/789 |
| 6,853,089 | B2 | * | 2/2005 | Ujiie et al. | ................ 257/783 |
| 7,009,288 | B2 | * | 3/2006 | Bauer et al. | ................ 257/690 |

* cited by examiner

*Primary Examiner*—Nitin Parekh
(74) *Attorney, Agent, or Firm*—Jianq Chyun IP Office

(57) ABSTRACT

A chip package structure comprising a substrate, a chip, a plurality of bumps, some buffer material and some encapsulation is provided. The substrate has a first surface and a corresponding second surface. The chip has an active surface and a back surface. The bumps are disposed between the active surface of the chip and the first surface of the substrate. The buffer material is disposed on the back surface of the chip. The encapsulation is disposed over the first surface of the substrate to enclose the chip and the buffer material.

13 Claims, 2 Drawing Sheets

CHIP PACKAGE STRUCTURE

CROSS-REFERENCE TO RELATED APPLICATION

This application claims the priority benefit of Taiwan application serial no. 93104889, filed on Feb. 26, 2004.

BACKGROUND OF THE INVENTION

1. Field of the Invention

The present invention relates to a chip package structure. More particularly, the present invention relates to a chip package structure having a higher bonding strength between its chip and a substrate.

2. Description of the Related Art

In the present information age, electronic products have become indispensable part of our lives. In general, a chip is at the core of most electronic products. Through the chip, many types of logic or data memory operations can be carried out. With the ever-advancing electronic technologies, more and more functionally powerful and personalized products are produced. Most of these electronic products can have a streamline, compact and miniature appearance due to a reduction of the interconnections linking semiconductor devices from the former 0.25 µm to about 0.15 µm or lower. In fact, the width of interconnections is now closing into the nanometer range.

With many breakthroughs in semiconductor fabrication techniques, many types of high-density semiconductor packages such as the flip-chip packages are produced. In the flip-chip technique, a plurality of bumps is formed on the bonding pads of a chip so that the chip can flip over and electrically connect with a substrate directly through the bumps. Compared with the conventional wire-bonding technique and the tape automated bonding (TAB) technique, the flip chip technique is able to provide a shorter electrical pathway that has a larger average cross-sectional area linking the substrate and the chip. Due to improved performance relative to other types of packages, flip chip packages have become the preferred package type in the semiconductor industry.

After bonding the chip to the substrate through the bumps, a plurality of solder balls may be implanted on the bottom surface of the substrate. Typically, solder balls fabricated from lead-tin alloy are often used because lead has a lower material cost. Furthermore, the process of fabricating lead-tin alloy, its in-process characteristics and reaction with other alloys as well as the preferred flux has been thoroughly investigated. Thus, lead-tin alloy plays an indispensable role in the packaging industry. However, lead is immensely toxic to the human body and hence is one of the major pollutants in our environment.

To reduce the poisoning effect of lead on our environment and human body, a lead-free alloy such as tin-silver-copper alloy has been developed and widely used to fabricate solder balls. Yet, lead-free solder balls need a higher reflow temperature, for example, between 240° C. to 260° C., for joining the lead-free solder balls and the substrate together. At such a high temperature, delamination between the bump and the chip or between the bump and the substrate may occur. Furthermore, delamination between the chip and the underfill material may also occur.

FIG. 1 is a schematic cross-sectional view of a conventional chip package. As shown in FIG. 1, the chip 110 and the substrate 120 are structurally bonded and electrically connected together through the bumps 130. An underfill material is injected into the space between the chip 110 and the substrate 120 to form an underfill layer 140 that encloses the bumps 130. The underfill layer 140 serves as a buffering layer to buffer against the shear stress in the bumps 130 due to a difference in the thermal coefficient of expansion between the chip 110 and the substrate 120. Thereafter, a molding compound 150 is deposited over the substrate 120 to encapsulate and protect the chip 110. Finally, lead-free solder balls are implanted on the bottom surface of the substrate 120 and a reflow process is performed to form a ball grid array (BGA) flip-chip package 100.

In the aforementioned process, the step of reflowing the implanted solder balls or bonding the BGA flip-chip package 100 to an external circuit (not shown) using the surface mount technology (SMT), a high temperature is often required. The heat may cause the molding compound 150 to pull the chip 110 up with a considerable force. The up pulling force on the chip 100 may cause the chip 110 and the bumps 130 or the bumps 130 and the substrate 120 to delaminate. Ultimately, the chip 110 and the underfill material 140 may delaminate as well.

SUMMARY OF THE INVENTION

Accordingly, at least one objective of the present invention is to provide a chip package structure capable of preventing any delamination between a chip and bumps or between the bumps and a substrate inside the package.

At least a second objective of the present invention is to provide a chip package structure capable of preventing any delamination between a chip and an underfill layer inside the package.

To achieve these and other advantages and in accordance with the purpose of the invention, as embodied and broadly described herein, the invention provides a chip package structure. The chip package structure comprises at least a substrate, a chip, a plurality of bumps, a buffer material and an encapsulation. The substrate has a first surface and a corresponding second surface. The chip is disposed on the first surface of the substrate. The chip has an active surface and a back surface. The bumps are disposed between the active surface of the chip and the first surface of the substrate. The buffer material is disposed on the back surface of the chip. The encapsulation is disposed over the first surface of the substrate to enclose the chip and the buffer material.

The present invention also provides an alternative chip package structure. The chip package structure comprises at least a substrate, a chip, a plurality of bumps, a buffer block, a buffer material and an encapsulation. The substrate has a first surface and a corresponding second surface. The chip is disposed on the first surface of the substrate. The chip has an active surface and a back surface. The bumps are disposed between the active surface of the chip and the first surface of the substrate. The buffer block is disposed on the back surface of the chip and the buffer material is disposed between the buffer block and the back surface of the chip. The encapsulation is disposed over the first surface of the substrate to enclose the chip, the buffer block and the buffer material.

In brief, the buffer material is disposed on the back surface of the chip so that the upward pull by the encapsulation on the chip and the corresponding downward pull by the substrate on the chip are attenuated. Thus, the probability of having a delamination between the bumps and the chip or the bumps and the substrate is significantly reduced. Similarly, the probability of having a delamination between the chip and the underfill layer is reduced as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
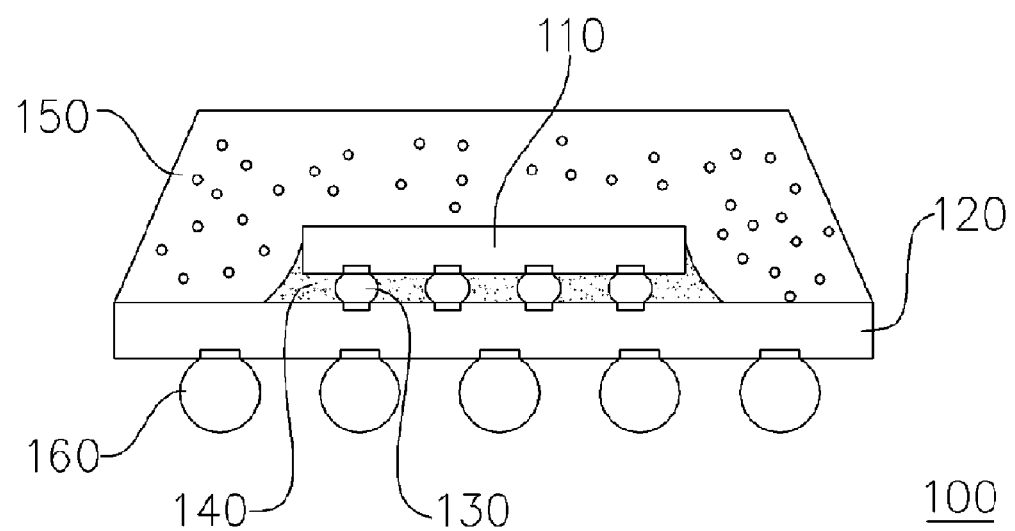
FIG. 1 is a schematic cross-sectional view of a conventional chip package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
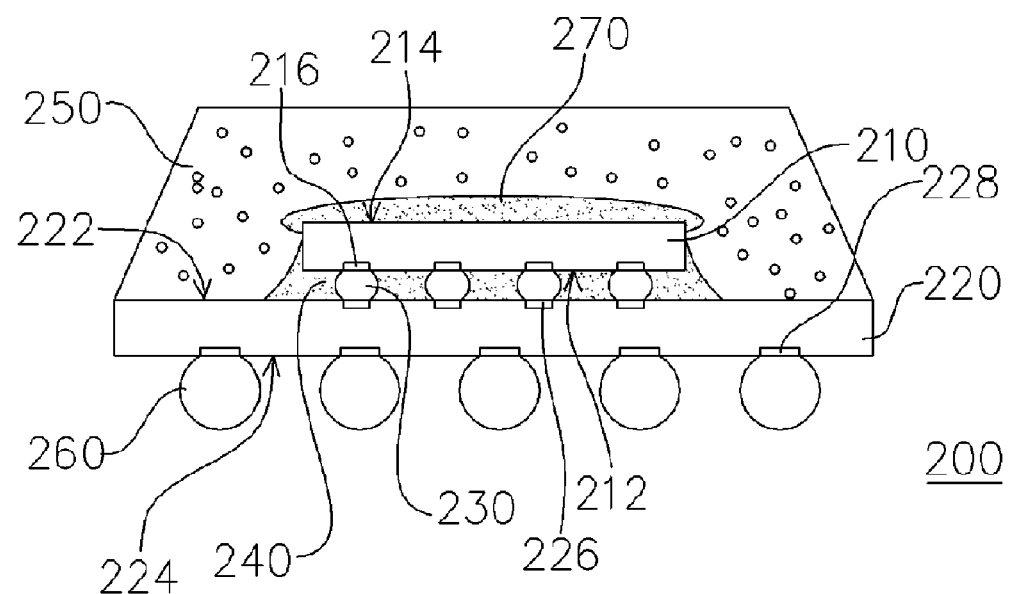
FIG. 2 is a schematic cross-sectional view of a chip package structure according to a first preferred embodiment of the present invention.

FIG. 2 is a schematic cross-sectional view of a chip package structure according to a first preferred embodiment of the present invention. As shown in FIG. 2, the chip package 200 comprises a substrate 220, a chip 210, a plurality of bumps 230, a buffer material 270, an encapsulation 250 and a plurality of solder balls 260. The substrate 220 has a plurality of first bonding pads 226 and a plurality of second bonding pads 228. The first bonding pads 226 are disposed on the first surface 222 of the substrate 220 and the second bonding pads 228 are disposed on the second surface 224 of the substrate 220. The chip 210 is disposed on the first surface 222 of the substrate 220. The chip 210 has a plurality of chip bonding pads 216 on an active surface 212.

The bumps 230 are disposed between the active surface 212 of the chip 210 and the first surface 222 of the substrate 220 linking up the chip bonding pads 216 and the first bonding pads 226 of the substrate 220. Hence, the chip 210 is able to connect with the substrate 220 both electrically and mechanically through the bumps 230. The bumps 230 can be fabricated using a lead-free alloy such as tin-silver-copper alloy or tin-silver alloy. The underfill layer 240 is disposed between the chip 210 and the substrate 220 such that the bumps 230 are enclosed. Through the underfill layer 240, shear stress between the chip 210 and the substrate 220 due to a difference in the coefficient of thermal expansion is buffered.

The buffer material 270 is disposed on the back surface 214 of the chip 210. The encapsulation 250 is disposed on the first surface 222 of the substrate 220 to enclose the chip 210 and the buffer material 270 and protect the chip 210. It should be noted that the buffer material is made from a soft and highly flexible material. The modulus of elasticity is smaller than 650 Mpa, for example. Preferably, the buffer material 270 and the chip 210 have great cohesion for each other. Similarly, the buffer material 270 and the encapsulation 250 also have great cohesion for each other.

The solder balls 260 are disposed on the second bonding pads 228 of the substrate 220. Through the solder balls 260, the substrate 220 is electrically connected to an external circuit (not shown). The solder balls 260 are fabricated using a lead-free alloy such as tin-silver-copper alloy or tin-silver alloy.

To fabricate the chip package 200, the chip 210 is first bonded to the substrate 220 through the bumps 230. Thereafter, the underfill material 240 is injected into the space between the chip 210 and the substrate 220 so that the bumps 230 are also enclosed. Then, the buffer material 270 is coated on the back surface 214 of the chip 210. After that, an encapsulation is formed over the substrate 220 to enclose the chip 210 and the buffer material 270. A ball mounting and reflow process is carried out to attach the solder balls 260 to the second bonding pads 228 on the substrate 220. Finally, a surface mount technology (SMT) is applied to connect the chip package 200 to an external circuit such as a motherboard.

Through the buffer material 270, the upward pull by the encapsulation on the chip 210 is attenuated significantly and consequently the downward pull by the substrate 220 on the chip is also attenuated. Therefore, when the substrate 220 is heated in the subsequent ball mounting and reflow process or the surface mount process, the probability of having a delamination between the bumps 230 and the chip 210 or the bumps 230 and the substrate 220 is greatly reduced. Similarly, the probability of having a delamination between the chip 210 and the underfill layer 240 is also reduced.

In the aforementioned process, the buffer material 270 is coated on the back surface 214 of the chip 210 after the chip 210 is bonded to the substrate 220. However, the present invention is not limited as such. It is equally feasible to coat the buffer material 270 on the back surface 214 of the chip 210 before joining the chip 210 and the substrate 220 together.

Figure 3:
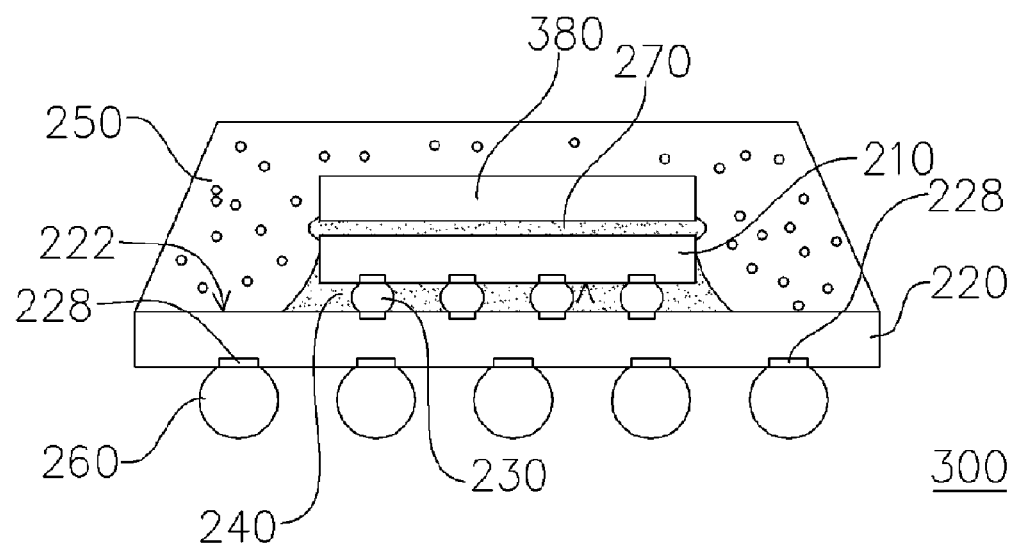
FIG. 3 is a schematic cross-sectional view of a chip package structure according to a second preferred embodiment of the present invention.

In practice, the bonding strength between the encapsulation and the buffer material may not be high. To resolve this problem, an additional buffer block is introduced. FIG. 3 is a schematic cross-sectional view of a chip package structure according to a second preferred embodiment of the present invention. In the second embodiment, the components identical to the ones in the first embodiment are labeled identically.

When the bonding strength between the encapsulation and the buffer material is not that strong, a buffer block can be disposed over the buffer material. Preferably, the buffer block has a strong bonding strength with the buffer material and the buffer block has a strong bonding strength with the encapsulation.

As shown in FIG. 3, the chip package structure 300 has a buffer block 380. Through the buffer material 270, the buffer block 380 is attached to the back surface 214 of the chip 210. The buffer block 380 can be a dummy die made from silicon, for example. Preferably, the buffer block 380 forms strong bonds with both the buffer material 270 and the encapsulation 250. In other words, the bonding strength between the buffer block 380 and the buffer material 270 is larger than the bonding strength between the encapsulation 250 and the buffer material 270. Furthermore, the bonding strength between the buffer block 380 and the encapsulation 250 is larger than the bonding strength between the encapsulation 250 and the buffer material 270.

The buffer material 270 is fabricated using a soft and flexible substance having a modulus of elasticity smaller than 650 MPa, for example. Preferably, the bonding strength between the buffer material 270 and the chip 210 and the bonding strength between the buffer material and the buffer block 380 are strong. The encapsulation 250 is disposed on the first surface 222 of the substrate 210 to enclose the chip 210 and the buffer block 380.

In the fabrication process, the chip 210 and the substrate 220 are bonded together before attaching the buffer block 380 to the back surface 214 of the chip 210. Alternatively, the buffer block 380 is attached to the back surface 214 of the chip 210 before bonding the chip 210 to the substrate 220.

When the aforementioned chip package 300 is heated in the solder ball implant and reflow process to attach lead-free solder balls 260 on the second bonding pads 228 of the substrate 220 or in the surface mount process to join the package 300 to an external circuit such as a motherboard, the encapsulation 250 will pull the buffer block 380 up slightly. However, the buffer material 270 is able to attenuate the upward pull by the buffer block 380 on the chip 210 and consequently reduce the downward pull by the substrate 220 on the chip 210. Therefore, delamination between the bumps 230 and the chip 210, between the bumps 230 and the substrate and between the chip 210 and the underfill layer 240 at a high temperature is substantially minimized.

In addition, the buffer block 380 is not limited to a silicon plate. The plate fabricated from some other materials including copper or aluminum plate is also permitted.

Figure 4:
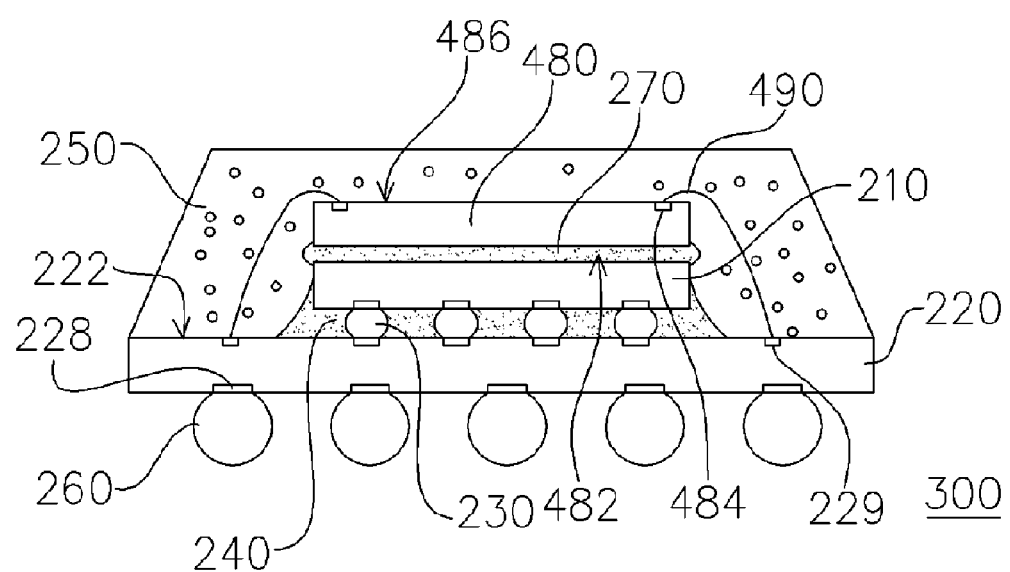
FIG. 4 is a schematic cross-sectional view of a chip package structure according to a third preferred embodiment of the present invention.

Beside a dummy chip, the buffer block can also be a functional chip capable of normal signal transmission. FIG. 4 is a schematic cross-sectional view of a chip package structure according to a third preferred embodiment of the present invention. In the third embodiment, the components identical to the ones in the first and the second embodiment are labeled identically.

As shown in FIG. 4, the buffer block 480 is an electrically functional chip having the capacity to transmit signals. The back surface 482 of the chip 480 is attached to the chip 210 through the buffer material 270. The chip 480 has a plurality of bonding pads 484 disposed on an active surface 486. Conductive wires 490 are wire-bonded to the chip bonding pads 484 on the chip 480 and the third boding pads 229 on the substrate 220 so that the chip 480 and the substrate 220 are electrically connected to each other.

When the aforementioned chip package 300 is heated in the solder ball implant and reflow process to attach lead-free solder balls 260 on the second bonding pads 228 of the substrate 220 or in the surface mount process to join the package 300 to an external circuit such as a motherboard, the encapsulation 250 will pull the chip 480 (the buffer block) up slightly. However, the buffer material 270 is able to attenuate the upward pull by the chip 480 (the buffer block) on the chip 210 and consequently reduce the downward pull by the substrate 220 on the chip 210. Therefore, delamination between the bumps 230 and the chip 210, between the bumps 230 and the substrate and between the chip 210 and the underfill layer 240 at a high temperature is substantially minimized.

In summary, the chip package of the present invention has a buffer material disposed on the back surface of the chip so that the upward pull by the encapsulation on the chip and the corresponding downward pull by the substrate on the chip are attenuated. Thus, delamination between the bumps and the chip or the bumps and the substrate is significantly reduced. Similarly, delamination between the chip and the underfill layer is reduced as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a substrate having a first surface and a corresponding second surface;
   a chip disposed on the first surface of the substrate, wherein the chip has an active surface and a corresponding back surface;
   a plurality of bumps disposed between the active surface of the chip and the first surface of the substrate;
   a buffer material disposed on the back surface of the chip;
   an encapsulation disposed on the first surface of the substrate to enclose the chip and the buffer material; and
   an underfill layer disposed between the chip and the substrate that encloses the bumps,
   wherein a portion of the encapsulation is disposed between the buffer material and the underfill layer and contacts with a part of the side surfaces of the chip, and the buffer material partially extends to the side surfaces of the chip and does not contact with the substrate and the underfill layer.

2. The chip package structure of claim 1, wherein the package further comprises a plurality of solder balls disposed on the second surface of the substrate.

3. The chip package structure of claim 2, wherein the material constituting the solder bails comprises lead-free solder.

4. A chip package structure, comprising:
   a substrate having a first surface and a corresponding second surface;
   a chip disposed on the first surface of the substrate, wherein the chip has an active surface and a corresponding back surface;
   a plurality of bumps disposed between the active surface of the chip and the first surface of the substrate;
   a buffer block disposed on the back surface of the chip;
   a buffer material disposed between the back surface of the chip and the buffer block; and
   an encapsulation disposed on the first surface of the substrate to enclose the chip and the buffer block; and
   an underfill layer disposed between the chip and the substrate that encloses the bumps,
   wherein a portion of the encapsulation is disposed between the buffer material and the underfill layer and contacts with a part of the side surfaces of the chip, and the buffer material partially extends to the side surfaces of the chip and does not contact with the substrate and the underfill layer.

5. The chip package structure of claim 4, wherein the package further comprises a plurality of solder balls disposed on the second surface of the substrate.

6. The chip package structure of claim 5, wherein the material constituting the solder balls comprises lead-free solder.

7. The chip package structure of claim 4, wherein the material constituting the buffer block comprises silicon.

8. The chip package structure of claim 4, wherein the material constituting the buffer block comprises copper.

9. The chip package structure of claim 4, wherein the material constituting the buffer block comprises aluminum.

10. The chip package structure of claim 4, wherein the bonding strength between the buffer block and the buffer material is larger than the bonding strength between the encapsulation and the buffer material and the bonding strength between the buffer block and the encapsulation is larger than the banding strength between the encapsulation and the buffer material.

11. The chip package structure of claim 4, wherein the buffer block comprises an electrically functional chip having the capacity to transmit signals, and the package further comprises a plurality of conductive wires electrically connecting the buffer block with the substrate.

12. A chip package structure, comprising:
- a substrate having a first surface and a corresponding second surface;
- a first chip disposed on the first surface of the substrate, wherein the first chip has an active surface and a corresponding back surface;
- a plurality of bumps disposed between the active surface of the first chip and the first surface of the substrate;
- a second chip disposed on the back surface of the first chip;
- a buffer material disposed between the back surface of the first chip and the second chip;
- a plurality of conductive wires electrically connecting the second chip with the substrate;
- an encapsulation disposed on the first surface of the substrate to enclose the conductive wires, the first chip and the second chip;
- an underfill layer disposed between the first chip and the substrate that encloses the bumps, wherein a portion of the encapsulation is disposed between the buffer material and the underfill layer and contacts with a part of the side surfaces of the first chip, and the buffer material partially extends to the side surfaces of the first chip and does not contact with the substrate and the underfill layer; and
- a plurality of solder balls disposed on the second surface of the substrate.

13. The chip package structure of claim 12, wherein the material constituting the solder balls comprises lead-free solder.

* * * * *